United States Patent [19]

Bennett et al.

[11] 4,454,179
[45] Jun. 12, 1984

[54] DRY TRANSFER ARTICLE

[75] Inventors: Richard E. Bennett; Donald V. Flatt, both of Hudson, Wis.

[73] Assignee: Minnesota Mining and Manufacturing Company, St. Paul, Minn.

[21] Appl. No.: 376,400

[22] Filed: May 10, 1982

[51] Int. Cl.³ ............................ C09J 7/02; B32B 3/00
[52] U.S. Cl. .................................... 428/41; 156/234; 427/147; 428/42; 428/43; 428/202; 428/207; 428/345; 428/424.8; 428/473.5; 428/474.4; 428/480; 428/913; 428/914
[58] Field of Search ............... 428/914, 345, 195, 207, 428/913, 40, 43, 41, 42, 202, 424.8, 473.5, 474.4, 480; 430/200, 280, 271, 253, 273; 156/234; 427/147

[56] References Cited

U.S. PATENT DOCUMENTS

| 2,567,067 | 9/1951 | Grupp et al. | 428/40 |
| 3,122,998 | 3/1964 | Raczynski et al. | 430/200 X |
| 3,432,376 | 3/1969 | Reed et al. | 156/234 |
| 3,519,456 | 7/1970 | Reed et al. | 428/207 |
| 3,684,544 | 8/1972 | Piron | 427/147 |
| 3,741,787 | 6/1973 | Tordjman | 156/234 X |
| 3,987,225 | 10/1976 | Reed et al. | 428/195 X |
| 4,028,165 | 6/1977 | Rosenfeld | 428/914 X |
| 4,028,474 | 6/1977 | Martin | 428/40 |
| 4,041,204 | 8/1977 | Hepher et al. | 428/195 X |
| 4,068,028 | 1/1978 | Samonides | 428/40 |
| 4,081,282 | 3/1978 | Merrill et al. | 430/273 |
| 4,177,309 | 12/1979 | Shadbolt et al. | 428/914 X |
| 4,282,308 | 8/1981 | Cohen et al. | 430/271 |
| 4,286,008 | 8/1981 | Reed et al. | 428/195 |
| 4,286,047 | 8/1981 | Bennett et al. | 430/280 |
| 4,291,114 | 9/1981 | Berggren et al. | 430/253 |

FOREIGN PATENT DOCUMENTS

| 959670 | 6/1964 | United Kingdom | 428/914 X |
| 2053497 | 4/1981 | United Kingdom | 430/253 |

Primary Examiner—Thomas J. Herbert, Jr.
Attorney, Agent, or Firm—Donald M. Sell; James A. Smith; James V. Lilly

[57] ABSTRACT

A dry transfer article comprising a carrier film bearing a graphic design in the form of one or more layers of ink and an actinic radiation responsive adhesive overlapping the design, the ink serving as a mask to actinic radiation such that only adhesive in non-ink areas is exposed to radiation creating a differential adhesive tack which allows the article to be positioned on the substrate and the carrier film and exposed adhesive to be selectively removed leaving the graphic design and underlying unexposed adhesive bonded to the substrate.

21 Claims, 3 Drawing Figures

DRY TRANSFER ARTICLE

DESCRIPTION

1. Technical Field

This invention relates to a dry transfer article and a method for making such article.

On site application of paint directly to a surface to be decorated is the time-honored method for providing a decorative design. Direct painting provides many aesthetic and physical features including realistic appearance, color flexibility, and durability to abrasion, weathering and chemical attack. However, direct painting suffers from a myriad of disadvantages including the need for relatively skilled labor, long application times, and potential contamination to adjacent areas (particularly mechanical equipment). Prefabricated film graphics have been utilized to avoid many of these disadvantages. Such graphics can be manufactured at a convenient location and applied by relatively unskilled labor on site efficiently with virtually no threat of contamination or health hazard.

2. Background Art

One type of prefabricated graphic involves adhesive backed sheets of polymeric film which are die cut and/or kiss cut to provide the desired design. The design is then bonded to the substrate by means of an adhesive backing. Such graphics are expensive owing to the large capital investment in equipment and are generally limited to relatively simple configurations. Moreover, there is a substantial amount of material waste inherent with this method.

Die or kiss cutting does serve to provide a dry transfer article in which the adhesive is in registry with the article. Registry may also be accomplished by exact registered application of the adhesive directly to the graphic design. U.S. Pat. Nos. 4,028,474 and 4,028,165 exemplify this approach. There is general recognition, however, that it is difficult and sometimes costly to achieve satisfactory alignment of adhesive and graphic, especially for intricate patterns.

Another approach, and the one to which this invention particularly relates, is to provide an article in the form of a continuous support film, a continuous non-registered adhesive coating and a graphic design interposed between the film and adhesive coating. After locating the article on the substrate, the carrier or support film and adhesive not underlying the graphic design are selectively removed, leaving only the graphic design and the underlying adhesive. Such selective removal requires separation of the graphic design from the carrier film and cleavage of the continuous adhesive layer at the graphic outline.

In U.S. Pat. No. 3,684,544, the adhesive is initially covered with a continuous silica coating which interferes with bonding the article to the substrate. Silica is displaced by adhesive in the regions underlying the ink design as a result of altering the adhesive rheology by applying pressure to the article to release a fluidity agent from the ink. U.S. Pat. No. 4,286,008 discloses an article in which a photopolymerizable ink is screen printed onto a carrier film. In one embodiment, an article is provided with an adhesive layer overlapping the ink layer. Cleavage of the adhesive layer along the edge of the ink is said to occur. U.S. Pat. No. 3,987,225 discloses an article of the type having a continuous adhesive layer. The adhesive is edge stressed by incorporating in the adhesive a solvent or dispersing powder. This is stated to permit the adhesive to shear cleanly along the edge of the design, eliminating residual particles, or strings of adhesive. U.S. Pat. No. 4,288,525 discloses a peel-apart dry transfer material in the form of opposing support layers between which is sandwiched a continuous photosensitive layer and a continuous image-forming layer. The image-forming layer may contain an adhesive component, or a separate adhesive layer may be provided between the image-forming layer and an adjacent carrier film, or the adhesive may be applied after the exposure and peel-apart development. One use of the dry transfer material is to place the developed structure on a rigid, transparent support, adhesive-side down, and irradiate through the support to provide a strong bond such that the carrier film can then be stripped away leaving the photosensitive layer, the image layer, and the adhesive bonded to the substrate.

United Kingdom Pat. No. 2,053,497 discloses a peel-apart laminate composed of opposing carrier sheets which are transparent or translucent, between which are sandwiched a continuous image-forming layer or at least one further layer which is photosensitive, and an adhesive layer. After imagewise exposure to actinic radiation through a transparency, the laminate is peeled apart providing two decals or signs, one a positive and the other a negative. Either is applied adhesive-side down to a substrate with the carrier sheet providing a protective covering for the underlying image layer.

The aforementioned patents are representative of the approaches taken to provide a dry transfer article. They rely upon mechanisms which are difficult to control or which, in some cases, dictate use of materials unable to withstand demanding environments to achieve clean separation/development of the transfer material elements. In other instances, the development mechanism dictates use of a single color graphics; a severe limitation to general use of the article. Further, in the case of prior photosensitive dry transfer articles, there is dependence for creation of the latent image upon the use of an external mask to provide the exposure pattern of actinic radiation.

DISCLOSURE OF THE INVENTION

The dry transfer article of the present invention constitutes an assemblage of elements which allows for physical development of the article in such a manner as to provide, upon removal of the carrier film at the time of application, selective cleaving of the adhesive along the outline of the ink defining the graphic design so as to retain on the substrate only the ink and the underlying adhesive. The development does not rely upon release of agents to disrupt bonds nor does it rely upon selective application of pressure by burnishing with, e.g., a stylus or the like. Moreover, inks and adhesives may be employed in the article of this invention which are capable of withstanding chemical and physical disruptive forces that have served to limit use of the transfer articles as direct paint substitutes for many purposes, especially exterior usage where abrasive or environmental conditions are severe.

The foregoing advantages, recognized and heretofore unobtainable objectives in the dry transfer article field, are achieved by the present invention in the form of a dry transfer article for application to a substrate to provide a design thereon, such article comprising a continuous, actinic radiation transparent carrier film presenting a major surface having first and second surface portions, a graphic pattern comprising at least one layer of radiation opaque, carrier film compatible ink bonded to the first portions of the major surface of the carrier film, and a continuous, actinic radiation responsive layer of adhesive, the adhesive having first segments bonded to the ink and second segments bonded to the second surface portions of the major surface of the carrier film, the adhesive upon exposure of the second segments to actinic radiation through the second surface portions being capable of providing a bond to the substrate whereby application of peel force to the carrier film allows selective separation from the substrate of the carrier film together with exposed second segments of the adhesive along the edge of said ink, leaving on the substrate ink and unexposed first segments of the adhesive.

Removal of the carrier film together with actinic radiation exposed adhesive leaving the ink layer and underlying unexposed adhesive bonded to the substrate, i.e., the development step, depends upon the proper balance of the adhesive and cohesive forces in such step. While there are myriad force relationships involved, the principal ones to consider are the forces of adhesion between the carrier film and the ink, the carrier film and exposed adhesive, the exposed adhesive and the substrate, the ink and unexposed adhesive, and unexposed adhesive and substrate. The article of this invention achieves the proper balance among the various relevant forces by the appropriate selection of materials, and the treatment of those materials. The invention thus further entails a method for making a developable dry transfer article comprising providing a continuous, actinic radiation transparent film presenting a major surface having first and second surface portions, applying to the first portions of the major surface an actinic radiation opaque, carrier film compatible ink, applying a continuous layer of actinic radiation responsive adhesive over the ink and the second surface portion of the major surface, exposing the article to a source of actinic radiation such that the ink masks passage of the actinic radiation to adhesive underlying the ink and the second surface transmits the actinic radiation to adhesive underlying the second portions, whereby upon application of the article to a given substrate, a peeling force applied to the carrier film enables selective removal of the carrier film and adhesive underlying the second surface portions of the film.

BRIEF DESCRIPTION OF THE DRAWINGS

The invention is further explained with reference to the drawings wherein.

DETAILED DESCRIPTION

Figure 1:
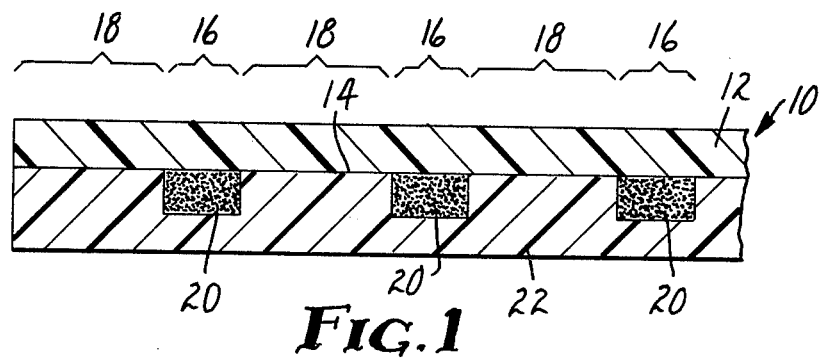
FIG. 1 is a cross-section view of a dry transfer article embodying the present invention prior to actinic radiation exposure.

Referring to FIG. 1, dry transfer article 10 includes a continuous, actinic radiation transparent carrier film 12 having a major surface 14 made up of surface areas 16 and 18. To surface areas 16 of major surface 14 is adhered actinic radiation opaque ink 20. A continuous layer of actinic radiation sensitive adhesive 22 covers the ink 20 and the surface areas 18 of major surface 14.

Figure 2:
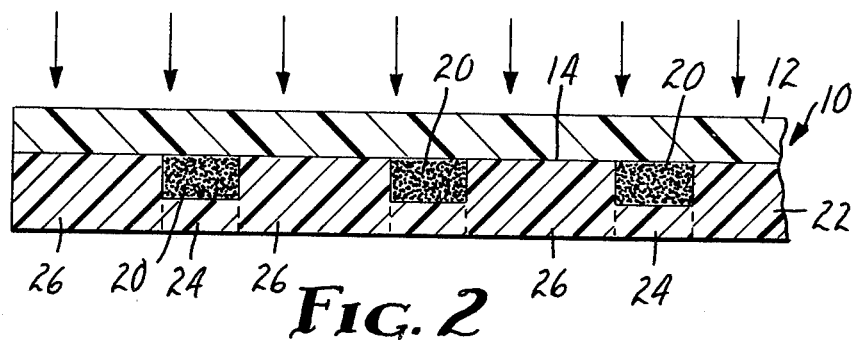
FIG. 2 is a cross-section view of the article of FIG. 1 after actinic radiation exposure.

In FIG. 2, the article 10 is exposed to actinic radiation (depicted by arrows) from the direction of the free major surface of carrier film 12. The ink 20 masks passage of the actinic radiation to segments 24 of adhesive 22. Actinic radiation passes through the carrier film 12 exposing segments 26 of adhesive 22 not underlying ink 20. Exposure of the adhesive segments 26 initiates a chemical reaction within the adhesive composition which results in reducing the adhesive potential to the substrate to which the article is to be applied relative to the adhesion potential to such substrate of unexposed adhesive sections 24.

Figure 3:
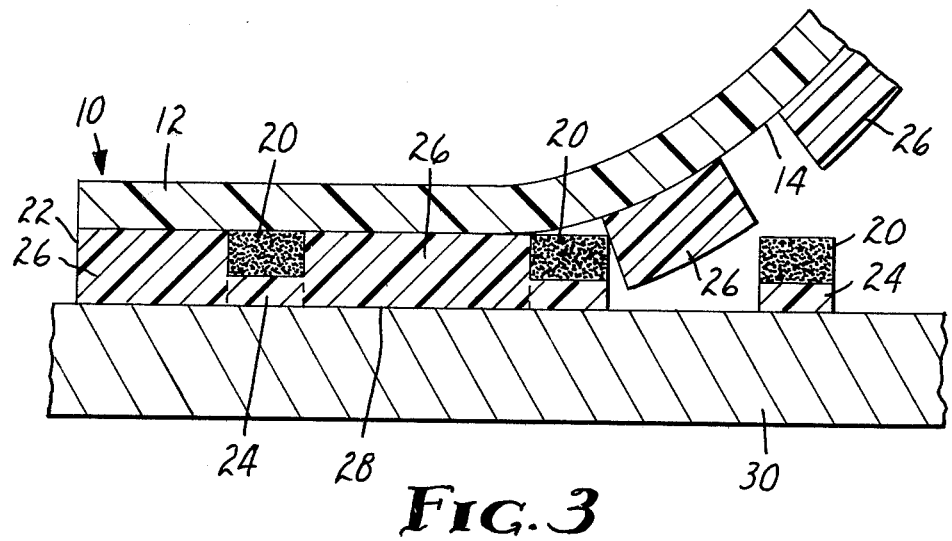
FIG. 3 is a cross-section view of the article of FIG. 2 applied to a substrate in the process of development showing partially removed carrier film.

In FIG. 3, article 10 in its exposed state (now exhibiting a latent, developable image) is applied to surface 28 of substrate 30 with pressure such as is exerted by a hand drawn squeegee. Development is accomplished by applying a peeling force from right to left to carrier film 12. The adhesion between the surface area 18 of film 12 and adhesive segments 26 exceeds the adhesion between the adhesive segments 26 and surface 28 of substrate 30 and allows for cleaving of the adhesive segments 26 from adhesive segments 24.

The adhesion between ink 20 and film surface 14 to which the ink is applied must be less than the adhesion between unexposed adhesive segments 24 and surface 28 of the substrate 30 to which article 10 is applied. As a consequence, film 12 and adhesive segments 26 separate from substrate 30, ink 20, and underlying adhesive segments 24, and upon continued peeling, the entire film 12 and adhesive segments 26 will separate in the same manner, leaving ink 20 bonded to surface 28 of substrate 30 by adhesive segments 24. The carrier film 12 containing adhesive segments 26 is then discarded.

The carrier film should be transparent to the actinic radiation, generally ultraviolet light, to which the adhesive is responsive. To enable accurate positioning of the article on the substrate, the carrier film should desirably be transparent to visible light. A carrier film should be selected which is mutually compatible with the ink employed; i.e., there is no interaction between the film and the ink (including components thereof) which will interfere with the above noted force relationships required for physical development, or will deleteriously affect the appearance of the graphic design.

The major carrier film surface to which the ink and adhesive is applied may be composed of various polymeric materials including polyethylene, polypropylene, polyimide, polyamide, and polyester. These materials may be in the form of a coating on paper. The major surface, which can have a smooth or matte finish, may be provided as a single, self-supporting ply or as two more plys or layers, an example of the latter being a coextruded film of polyethylene/nylon/polyethylene available under the trade name Crown Zeelon 305. A preferred carrier is a 2 mil, transparent, bi-axially oriented polypropylene film. The carrier should be free of or contain limited quantities of additives which might bloom or migrate to the ink/carrier film interface to interfere with the development of the appropriate bonds between film surface, ink, and adhesive as previously explained.

Types of ink which may be employed include solvent-based inks, multi-component chemically reactive inks, and actinic radiation curable inks. Solvent-based inks utilize a polymeric binder such as polyvinyl chloride or acrylic resin which is dissolved in a suitable solvent, printed on the desired surface, and dried. In multi-component, chemically reactive systems, reactive components are dissolved or dispersed in a suitable liquid medium, printed, solvent evaporated and then cured by the reaction of the reactive components. A typical multi-component, chemically reactive system involves a co-reactive polyol resin and polyisocyanate to yield a polyurethane ink. Actinic radiation curable ink systems entail use of reactive prepolymers and monomers such as urethane-acrylates responsive to actinic radiation, generally ultraviolet light, to effect curing.

Solvent-based inks may be used in combination with carrier films having a major surface composed of polyethylene, polypropylene, polyimide, polyamide, and polyethylene terephthalate, i.e., polyesters. In the case of the multi-component, chemically reactive ink system and the actinic radiation curable ink system, the major surface of the carrier film may be polyethylene or polypropylene.

To provide the proper bond strength between the polyethylene or polypropylene carrier film surface and the underlying exposed adhesive, the film surface overlying the exposed adhesive should have a surface energy greater than the untreated film. For polyethylene and polypropylene surfaces, treatment with corona discharge after the ink has been applied, but before the adhesive has been laid down, will result in increased surface energy for the film surface not bearing the ink. Such corona treatment also provides an increase in the bond strength between ink and the subsequently applied adhesive (unexposed adhesive segments 24). Since the ink covers surface areas 16 of film 12 at the time of corona treatment, surface areas 16 are unaffected by the treatment. Other surface treatments may also be employed to increase the surface energy, e.g., flame or chemically etching or plasma. In the case of other film surfaces (e.g. polyesters and polyamides) the surface energy is inherently greater than that of the untreated polyolefins and surface treatment is not required.

The ink should be opaque to the actinic radiation to which the adhesive is responsive. Opacity in the context of this invention means that the ink, as deposited on the carrier film in one or more layers, will block passage of sufficient actinic radiation relative to those portions of the carrier film free of ink such that a latent pattern defined by chemically reacted and unreacted adhesive is provided which can be physically developed as herein described. The ink formulation contains a polymeric component, preferably a high tensile strength polymer or resin such as polyvinyl butyral, cellulose nitrate, cellulose acetate, alkyds and alkyds modified or copolymerized with drying oil; styrene, urethane, vinyl, acrylic resin, polyvinylhalides, polyurethanes, urethane-acrylates, epoxy polymers, epoxy-phenolic, epoxy-polyamide and catalyzed epoxy resins and copolymers; urea-, melamine-, and benzoguanoamino-formaldehyde polymers; chlorinated and isomerized rubber, polystyrene and polyvinyl toluene; polyacrylates, polymethacrylates and thermosetting acrylic resins. The ink may be applied as a solution, dispersion or emulsion in organic solvent medium or water, the solvent or water being removed after application. Any convenient pigment well known for use in printing inks may be used in the ink formulations of the present invention including pigments modified by coating the pigment particles with surface active agents to improve dispersibility and increase covering power.

The ink may be applied by a variety of conventional coating or printing techniques. Screen printing is a preferred technique. The ink graphic can be a mono-layer or multi-colored, multi-layers, typically ranging in overall thickness from 0.0075 mm—0.025 mm.

The adhesive employed in the practice of this invention is an actinic radiation sensitive, generally ultraviolet light sensitive, composition. The adhesive layer typically ranges from 0.005 mm to 0.025 mm, preferably 0.005 mm to 0.01 mm, in thickness and is preferably either a normally tacky (at room temperature) pressure-sensitive adhesive or a heat activatable adhesive with an inherent viscosity of 0.3 dl/g to 1.1 dl/g. The adhesive is modifiable by exposure to actinic radiation reducing tack and increasing cohesive strength relative to unexposed adhesive. Unexposed adhesive retains its high tack qualities and integrity to provide high resistance of the article to abrasion, marring, natural environments; e.g., weathering, and adhesion to common substrates such as metal, paint, wood, glass, and plastics. Preferably the adhesive composition includes a reactant system containing from about 5–25%, preferably 7–18% by weight of an oxirane-ring containing component such as glycidyl acrylate, glycidyl methacrylate, or glycidyl allyl ether. At such levels of oxirane-ring containing component, particularly the preferred levels, there is adequate residual tack exhibited by the exposed adhesive to permit the transfer article to be temporarily retained on the substrate to permit correct positioning. Also, at such levels the unexposed adhesive exhibits the degree of integrity necessary to permanently retain the graphic on the substrate in severe environments. The reactant system further contains from about 75% to about 95% by weight of one or more additional vinyl containing reactive monomers. About 55 to 80% by weight of the additional vinyl monomers are provided by one or more of the following: isooctyl acrylate, n-butyl acrylate, 2-ethylhexyl acrylate, 2-methyl butyl acrylate and lauryl methacrylate; 1–35% by weight of N-vinyl pyrrolidone and/or methyl acrylate; and 0–10% by weight of one or more of acrylamide, acrylic acid, hydroxyethyl acrylate and a vinyl silane such as that sold under the trade name A-174 Silane by Dow Corning Co.

Also present in the adhesive composition is an effective amount, generally on the order of 3% by weight of the reactant system, of an ionic photoinitiator capable of promoting polymerization of the oxirane rings. Many photoinitiators are known to promote the polymerization of epoxides. Among the most effective are the radiation-sensitive aromatic onium salts of group Va and VIa as respectively disclosed in U.S. Pat. Nos. 4,069,066 and 4,058,401, certain diaryl halonium salts containing group Va metal hexafluorides as disclosed in U.S. Pat. No. 3,981,897, certain onium catalysts of Groups Va, VIa and VIIa atoms as disclosed in U.S. Pat. No. 4,101,513, and triarylsulfonium complex salts of the formula

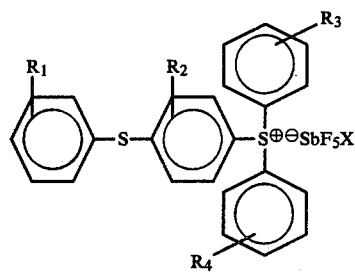

where X is F or OH and $R_1$, $R_2$, $R_3$, and $R_4$ are each selected from H, lower alkyl, alkoxy or halogen.

Sources of ultraviolet light are, of course, well known, including, e.g., germicidal lamps or low intensity black lights; a detailed discussion of light sources suitable for practicing the present invention is included in U.S. Pat. No. 4,058,401. While the onium salt photoinitiators useful in the invention are per se photosensitive only in the ultraviolet portion of the electromagnetic spectrum, they can be rendered effective in the near ultraviolet and visible portions of the spectrum by incorporating sensitizing agents such as 2-ethyl-9,10 dimethoxyanthracene and 9,10-diethoxyanthracene; see, e.g., U.S. Pat. No. 4,069,054.

Exposure of the adhesive to actinic radiation through the carrier film alters the properties of the adhesive in the non-ink areas. The ink serves as a mask to actinic radiation, thereby leaving the adhesive beneath the ink unchanged. The adhesive property changes include reduced tack and increased cohesive strength. Upon application of the article to a substrate, the reduced tack of the adhesive in the non-ink areas permits easy removal of the exposed adhesive and carrier film. The cohesive strength difference between the exposed and non-exposed adhesive permits the adhesive layer to cleave precisely at the perimeter of the ink.

The article of this invention may be prepared by applying one or more layers of ink to the carrier film to provide the desired graphic design, and allowing the ink to dry or cure depending on the type of ink employed. Screen printing is the preferred ink application method although many conventional coating and printing techniques may be employed. Thereafter, the surface of the carrier film bearing the ink is exposed, if necessary, to a conventional corona discharge unit (ENI Power Systems Model RS-8 Corona Surface treater, for example) to provide increased surface free energy. After the corona treatment, the adhesive composition is applied by conventional coating or laminating techniques to the carrier film/ink surface. Adhesive coating weights range from about 4.2 gm/m² to 42.0 gm/m², preferably 8–13 gm/m². After drying of the adhesive, if necessary, a conventional release liner is applied to the free surface of the adhesive for protective purposes. The resulting article is then exposed to actinic radiation through the free major surface of the carrier film for a period of time to initiate the chemical reaction of the adhesive in the non-ink areas. The release liner is then removed and the article positioned on the desired substrate. Moderate pressure is applied by stroking a squeegee across the face of the carrier film. The carrier film is then grasped manually and peeled away, taking with it the exposed adhesive and leaving the ink defining graphic bonded to the substrate by means of unexposed, underlying adhesive. If necessary, further pressure can be applied to the ink surface to assure a stronger bond to the substrate.

In the following examples, all parts and percentages are by weight unless otherwise stated.

EXAMPLE 1

A sheet of 2 mil, biaxially oriented, polyproplyene (surface tension below 34 dynes/cm) is screen printed to provide a graphic design using a 157 mesh screen and the following ink:

|  | wt. |
|---|---|
| Desmophen 670-90[1] | 23.0 |
| Desmophen 651A-65[1] | 31.0 |
| Desmodur N-100[2] | 30.0 |
| Krolor Yellow KY-781-D[3] | 30.0 |
| Butyl Cellosolve Acetate[8] | 11.7 |
| CAB-381-0.1[4] | 1.0 |
| Tinuvin 770[5] | 0.8 |
| Tinuvin 328[5] | 0.4 |
| Irganox 1010[6] | 0.4 |
| Multiflow[7] | 1.7 |

[1]Trade name of Mobay Chemical Co. for a polyester polyol resin
[2]Trade name of Mobay Chemical Co. for a polyisocyanate
[3]Trade name of Mobay Chemical Co. for a yellow pigment
[4]Trade name of Eastman Chemical Co. for cellulose acetate butyrate
[5]Trade name of Ciba-Geigy Co. for an ultraviolet light absorber
[6]Trade name of Ciba-Geigy Co. for an antioxidant
[7]Trade name of Monsanto Co. for a levelling agent
[8]Trade name of Union Carbide Co. for a solvent The ink is air dried for one hour and oven dried for one hour at 150° F. A second overlapping graphic design is screen printed onto the film with a 157 mesh screen using the following ink:

|  | wt. |
|---|---|
| Desmophen 670-90 | 23.0 |
| Desmophen 651A-65 | 21.0 |
| Desmodur N-100 | 30.0 |
| Bayferrox, black 318M[1] | 30.0 |
| Butyl Cellosolve Acetate | 11.7 |
| CAB-381-0.1 | 1.0 |
| Tinuvin 770 | 0.8 |
| Tinuvin 328 | 0.4 |
| Irganox 1010 | 0.4 |
| Multiflow | 1.7 |

[1]Trade name of Mobay Chemical Co. for a black pigment

The ink is air dried for one hour and oven dried for 16 hours at 150° F. The inked side of the polypropylene is then corona treated using an ENI Power Systems MRS-8 Corona Surface Treater to provide the uncovered areas of the film with a surface tension of greater than 40 dynes/cm as measured by ASTM D2578-67. The surface tension of the untreated film is about 34 dynes/cm.

The treated film/ink is then knife bar coated with the following adhesive having an inherent viscosity of 0.67 dl/g:

Isooctyl acrylate/glycidyl methacrylate/acrylamide/-methyl acrylate (62/10/3/25 by weight)
Solids 20% weight in ethyl acetate
Triarylsulfonium complex salts 3% weight of solid adhesive The adhesive is dried five minutes at 150° F. to provide a dry weight of 12.6 gm/m² and a silicone coated release liner is laminated to the adhesive. The laminated construction is passed through a Linde Photocure System at 2400 cm/min. three times with the polypropylene side facing two medium pressure Hg lamps.

The silicone release liner is removed and the article placed with the adhesive against the paint surface of a painted steel weathering panel (Q panel). Moderate pressure is applied to the free surface of the carrier film by stroking with the edge of a polyethylene squeegee (3M Co. PA-1 plastic applicator tool) over the graphic area. The carrier film is then peeled off the painted surface, leaving the graphic on the paint. No adhesive remains on the edge of the graphic or on the paint where there is no ink.

The applied graphic is then tested for abrasion resistance with a Taber Abraser using C-17 wheels and a 500 gram load. Relative values are given to the appearance of the graphic after a determinant number of cycles. The graphic is found to resist abrasion for more than 150 cycles.

EXAMPLES 2-12

The procedure of Example 1 is repeated with the following adhesive compositions substituted for that shown in Example 1.

|  | Reactive Monomer | Oxirane-Ring Component | | Other |
|---|---|---|---|---|
| Ex. | IOA | GMA | GA | Reactive Monomers |
| 2 | 84 | 15 | | 1AA |
| 3 | 80.9 | 15 | | 4 ACM, 0.1 silane |
| 4 | 47 | 15 | | 35 MA, 3 HEA |
| 5 | | 20 | | 80 BA |
| 6 | | 15 | | 85 LMA |
| 7 | 70 | 15 | | 15 NVP |
| 8 | 70 | | 15 | 15 NVP |
| 9 | 63.5 | 10 | | 25 MA, 1.5 ACM |
| 10 | 55 | 15 | | 30 MA |
| 11 | 62 | 10 | | 3 ACM, 25 MA |
| 12 | 65 | | 15 | 20 NVP |

IOA — isooctyl acrylate
GMA — glycidyl methacrylate
GA — glycidyl acrylate
LMA — lauryl methacrylate
AA — acrylic acid
ACM — acrylamide
MA — methyl acrylate
BA — n-butyl acrylate
Silane — A-174 Silane - (trade name of Dow Corning Co.)
HEA — hydroxyethyl acrylate
NVP — N—vinyl pyrrolidone

EXAMPLE 13

A sheet of 2 mil polyethylene (surface tension below 34 dynes/cm) is screen printed to provide a graphic design using a 157 mesh screen and the following ink:

| Elvacite 2042[1] | 15.70 |
|---|---|
| Bakelite VYHH[2] | 6.30 |
| Monastral Red[3] | 6.05 |
| Carbitol Acetate[5] | 5.60 |
| Penola 150[4] | 46.77 |
| Cyclohexanone | 14.28 |
| TS-407[4] | 5.30 |

[1]Trade name of DuPont Co. for an acrylic resin
[2]Trade name of Union Carbide Co. for a polyvinyl chloride.
[3]Trade name of DuPont Co. for a red pigment
[4]Trade name for an aromatic solvent
[5]Trade name of Union Carbide Co. for a solvent The ink is oven dried for one hour at 150° F. The inked side of polyethylene is then corona treated using an ENI Power Systems MRS-8 Corona Surface Treater to provide the uncovered areas of the film with a surface tension of greater than 40 dynes/cm.

The treated film-ink is then knife bar coated with the following adhesive having an inherent viscosity of 0.61 dl/g:
Isooctyl acrylate/glycidyl methacrylate/N-vinyl pyrrolidone (70/15/15 by weight)
Solids 20% weight in ethyl acetate
Triarylsulfonium complex salts 3% weight of solid adhesive The adhesive is dried five minutes at 150° F. to provide a dry weight of 12.6 gm/m² and a silicone coated release liner laminated to the adhesive. The laminated construction is passed through a Linde Photocure System at 2400 cm/min. three times with the polyethylene side facing two medium pressure Hg lamps.

The silicone release liner is removed and the article placed with the adhesive against the paint surface of a painted steel weathering panel (Q panel). Moderate pressure is applied to the free surface of the carrier film by stroking with the edge of a polyethylene squeegee over the graphic area. The carrier film is then peeled off the painted surface leaving the graphic on the paint. No adhesive remains on the edge of the graphic or on the paint where there is no ink.

The applied graphic is then tested for abrasion resistance with a Taber Abraser using C-17 wheels and a 500 gram load. Relative values are given to the appearance of the graphic after a determinant number of cycles. The graphic is found to resist abrasion for more than 20 cycles.

EXAMPLE 14

A sheet of 2 mil polypropylene (surface tension below 34 dynes/cm) is screen printed with a 390 mesh screen using NazDar UV 111 black ink (commercially available from NazDar Co.)

The ink is cured wih a Linde Photocure system, two passes at 1524 cm/min., nitrogen atmosphere, 30 psi. The inked side of the polypropylene is then corona treated using an ENI Power Systems MRS-8 Corona Surface Treater to provide the uncovered areas of the film with a surface tension of 40 dynes/cm.

The carrier-ink is laminated to an adhesive of the following composition:
Isooctyl acrylate/glycidyl methacrylate/methyl acrylate/acrylamide (64/10/25/1 by weight)
The inherent viscosity is 0.73 dl/g and is coated at 12.6 gm/m²

The laminated construction is passed through a Linde Photocure System at 2400 cm/min. three times with the polypropylene side facing two medium pressure Hg lamps.

The silicone release liner is removed and the article is placed with the adhesive against the paint surface of a painted steel weathering panel (Q panel). Moderate pressure is applied to the free surface of the carrier film by stroking with the edge of a polyethylene squeegee over the graphic area. The carrier film is then peeled off the painted surface, leaving the graphic on the paint. No adhesive remains on the edge of the graphic or on the paint where there is no ink.

EXAMPLE 15

A sheet of 2 mil polyethylene (surface tension below 34 dynes/cm) is screen printed with a 157 mesh screen which contains an image using the following ink:

|  | wt. |
|---|---|
| Bakelite VYNS[1] | 8.80 |
| Bakelite VYHH[1] | 3.38 |
| Ferro 1237[2] | 0.24 |
| Titanox 2160[3] | 43.89 |
| Dioctylphthalate | 3.81 |
| SF-96 silicone[4] | 0.02 |
| Cyclohexanone | 25.50 |
| Isophorone | 12.29 |
| TS-407 | 1.75 |
| Xylol | 0.23 |

[1]Trade name of Union Carbide Co. for a polyvinyl chloride solution resin
[2]Trade name of Ferro Co. for a heat stabilizer
[3]Trade name of National Lead Co. for a white pigment
[4]Trade name of General Electric Co. for a silicone flow additive The ink is oven dried for one hour at 150° F. The inked side of the polyethylene is then corona treated using an MRS-8 Corona Surface Treater to provide the uncovered areas of the film with a surface tension of greater than 40 dynes/cm.

The treated film-ink is then knife bar coated with the following adhesive having an inherent viscosity of 0.61 dl/g:
Isooctyl acrylate/glycidyl methacrylate/N-vinyl pyrrolidone (70/15/15 by weight)
Solids 20% weight in ethyl acetate
Triarylsulfonium complex salts at 3% weight of solid adhesive The adhesive is dried five minutes at 150° F. to provide a dry weight of 12.6 gm/m$^2$ and a silicone coated release liner laminated to the adhesive. The laminated construction is passed through a Linde Photocure System at 2400 cm/min. three times with the polyethylene side facing two medium pressure Hg lamps.

The silicone release liner is removed and the article placed with the adhesive against the paint surface of a painted steel weathering panel (Q panel). Moderate pressure is applied to the free surface of the carrier film by stroking with the edge of a polyethylene squeeqee over the graphic area. The carrier film is then peeled off the painted surface, leaving the graphic on the paint. No adhesive remains on the edge of the graphic or on the paint where there is no ink.

The applied graphic is then tested for abrasion resistance with a Taber Abraser using C-17 wheels and a 500 gram load. The graphic is found to resist abrasion for more than 20 cycles.

EXAMPLE 16

A sheet of 2 mil polyester (surface tension 52 dynes/cm) is screen printed to provide a graphic design using a 157 mesh screen and the following ink:

|  | wt. |
|---|---|
| Bakelite VYNS | 8.80 |
| Bakelite VYHH | 3.38 |
| Ferro 1237 | 0.24 |
| Titanox 2160 | 43.89 |
| Dioctylphthalate | 3.81 |
| SF-96 silicone | 0.02 |
| Cyclohexanone | 25.50 |
| Isophorone | 12.29 |
| TS-407 | 1.75 |
| Xylol | 0.23 |

The ink is oven dried for one hour at 150° F.
The film-ink is then knife bar coated using the following adhesive having an inherent viscosity of 0.51 dl/g:
Isooctyl acrylate/glycidyl methacrylate/N-vinyl pyrrolidone (70/15/15 by weight)
Solids 20% weight in ethyl acetate
Triarylsulfonium complex salts 3% weight of solid adhesive.

The adhesive is dried five minutes at 150° F. to provide a dry weight of 12.6 gm/m$^2$ and a silicone coated release liner laminated to the adhesive. The laminated construction is passed through a Linde Photocure System at 2400 cm/min. three times with the polyester side facing two medium pressure Hg lamps.

The silicone release liner is removed and the article placed with the adhesive against the paint surface of a painted steel weathering panel (Q panel). Moderate pressure is applied to the free surface of the carrier film by stroking with the edge of a polyethylene squeegee over the graphic area. The carrier film is then peeled off the painted surface, leaving the graphic on the paint. No adhesive remains on the edge of the graphic or on the paint where there is no ink.

EXAMPLE 17

Example 16 is repeated employing 1 mil polyamide (surface tension 62 dynes/cm) as the carrier film. The same results are obtained.

The transfer article of the present invention is composed of structural elements which function to provide the balance of adhesive and cohesive forces necessary to effect clean transfer of the ink defining image and associated adhesive from the article to the substrate without reliance upon migration of agents from one layer to another to alter bond strengths. Special solvent penetrable coatings for the carrier film are unnecessary. The minimum number of structural elements are required; extra layers between the ink and carrier film or elsewhere are unnecessary. The adhesive is preferably normally tacky at room temperature but which upon actinic radiation exposure is converted to a state exhibiting relatively no tack or at least low tack properties and is cleavable along the exposed/unexposed demarcation line by means of a generally applied peel force as opposed to a localized burnishing action. Imagewise exposure of the adhesive is controlled by the ink pattern located on the carrier film, thus eliminating the need for reliance upon external masks, templates, negatives, and the like. The transfer article provides both aesthetic and functional versatility in that a wide variety of mono- and multi-colored graphics may be provided which exhibit resistance to severe weather and other conditions.

We claim:
1. A dry transfer article for application to a substrate to provide a design thereon, such article comprising a continuous, actinic radiation transparent carrier film presenting a major surface having first and second surface portions thereon, a graphic pattern comprising at least one layer of a radiation opaque, compatible ink composition bonded to said first portions of said major surface of said carrier film, and a continuous, actinic radiation responsive layer of adhesive having first segments covering ink composition containing said first portions and second segments covering non-ink composition containing said second portions, said adhesive upon exposure of said second segments to actinic radiation through said second surface portions being capable of providing a bond to said carrier whereby, upon adhering of said article to said substrate, application of a peel force to said carrier film allows selective separation from said substrate of said carrier film together with exposed second segments of said adhesive along the edge of said ink composition, leaving on said substrate said ink composition and unexposed first segments of said adhesive.

2. The article of claim 1 wherein said major surface of said carrier film is composed of a material selected from the class consisting of polyester, polyimide and polyamide.

3. The article of claim 1 wherein said ink composition comprises a polyurethane polymer base.

4. The article of claim 1 wherein said adhesive comprises a reaction product of a reactive system comprising isooctyl acrylate, at least one oxirane-ring containing vinyl compound selected from the class consisting of glycidyl methacrylate, glycidyl allyl ether, and glycidyl acrylate, and at least one additional vinyl containing monomer selected from the class consisting of N-vinyl pyrrolidone, methyl acrylate and acrylamide.

5. The article of claim 1 wherein said adhesive is a normally tacky, pressure-sensitive adhesive.

6. The article of claim 1 wherein said ink composition comprises an ultraviolet light cured composition.

7. The article of claim 1 wherein said ink composition comprises a polyvinyl chloride resin and acrylic resin.

8. The article of claim 1 wherein there is a plurality of layers of actinic radiation opaque, compatible ink composition.

9. The article of claim 1 wherein said major surface of said carrier film is polypropylene, said ink composition comprises a polyurethane polymer base, and said adhesive comprises an effective amount of an ionic photoinitiator, a reaction product of a reactive system comprising from about 5% to about 25% by weight of at least one oxirane-ring containing vinyl compound, and at least 75% by weight of at least one additional vinyl containing monomer.

10. The article of claim 9 wherein said second surface portions of said polypropylene major surface are treated to increase the surface free energy thereof.

11. The article of claim 1 wherein said major surface of said carrier film is a material selected from the class consisting of polyethylene and polypropylene.

12. The article of claim 11 wherein said second portions of said major surface of said carrier film are corona discharge treated.

13. The article of claim 1 wherein said adhesive comprises an effective amount of an ionic photoinitiator and the reaction product of a reactive system comprising an oxirane-ring containing vinyl compound and at least one additional vinyl containing monomer.

14. The article of claim 13 wherein said oxirane-ring containing vinyl compound is present in said reactive system to the extent of about 7% to about 18% by weight.

15. The article of claim 14 wherein said oxirane-ring containing vinyl compound is selected from the class consisting of glycidyl acrylate, glycidyl methacrylate, and glycidyl allyl ether.

16. A process for making a dry transfer article comprising the steps of (1) providing a continuous, actinic radiation transparent film presenting a major surface having first and second surface portions thereon, (2) applying to said first surface portions of said major surface an actinic radiation opaque, compatible ink composition, (3) applying a continuous layer of actinic radiation responsive adhesive over ink composition containing said first portions and non-ink composition containing said second portions, said adhesive thus having first segments bonded to said ink composition and second segments bonded to said second surface portions of said major surface of said carrier film, and (4) exposing said article to actinic radiation such that said ink composition masks passage of said actinic radiation to said first segments of said adhesive and said second surface portions transmit said actinic radiation to said second segments of said adhesive whereby, upon application of said article to a given substrate, a peeling force applied to said carrier film allows selective separation from said substrate of said carrier film together with exposed second segments of said adhesive along the edge of said ink composition, leaving on said substrate said ink composition and unexposed first segments of said adhesive.

17. The process of claim 16 wherein said major surface of said film comprises a material selected from the class consisting of polyester, polyimide, and polyamide.

18. The process of claim 16 wherein said major surface of said carrier film comprises polyethylene or polypropylene.

19. The process of claim 16 wherein between steps (2) and (3), a further step is provided comprising treating said major surface of said carrier film, having said ink composition on said first surface portions thereof, to increase the surface free energy of said second surface portions relative to the surface free energy of said first surface portions.

20. The process of claim 16 wherein said adhesive is a normally tacky, pressure-sensitive adhesive.

21. The process of claim 16 wherein said ink composition is applied in a plurality of layers.

* * * * *